United States Patent [19]

Ichikawa

[11] Patent Number: 4,918,407

[45] Date of Patent: Apr. 17, 1990

[54] OSCILLATION CIRCUIT

[75] Inventor: Yuichi Ichikawa, Gunma, Japan

[73] Assignee: Sanyo Electric Co., Ltd., Moriguchi, Japan

[21] Appl. No.: 407,188

[22] Filed: Sep. 14, 1989

[30] Foreign Application Priority Data

Sep. 19, 1988 [JP] Japan .................................. 63-234124

[51] Int. Cl.$^4$ .............................................. H03L 7/00
[52] U.S. Cl. ......................................... 331/25; 331/34; 331/23; 332/127
[58] Field of Search ................... 331/8, 16, 17, 23, 25, 331/34; 332/127; 358/23

[56] References Cited

U.S. PATENT DOCUMENTS 4,376,268  3/1983  Moriya et al. ..................... 331/25 X Primary Examiner—Eugene R. LaRoche
Assistant Examiner—Robert J. Pascal
Attorney, Agent, or Firm—Armstrong, Nikaido, Marmelstein, Kubovcik & Murray

[57] ABSTRACT

A first multivibrator 12 is provided as an oscillation circuit for FM modulating a luminance signal. In addition, a second multivibrator 14 is separately provided which has the same circuit configuration as that of the first multivibrator 12. An oscillation output signal of the second multivibratory 14 is compared in phase with an oscillation output signal of a fixed oscillation circuit 17 in a phase comparing circuit 16. After being smoothed in a smoothing circuit 18, an error output of the phase comparing circuit 16 is fed back to the second multivibrator 14 to control an oscillation frequency of this second multivibrator 14. An output of the smoothing circuit 18 is also applied to the first multivibrator 12 to control the oscillation frequency of the second multivibratory 12. Therefore, the first multivibrator 12 has its oscillation frequency set to a predetermined value in the same manner as the second multivibrator 14 does.

8 Claims, 3 Drawing Sheets

OSCILLATION CIRCUIT

BACKGROUND OF THE INVENTION

1. Field of the Invention

The present invention relates generally to oscillation circuits adaptable to FM modulation circuits employed in home VTR (Video Tape Recorders) and the like.

2. Description of the Background Art

In recording a luminance signal, in a home VTR, the luminance signal is clamped in a clamping circuit to make uniform direct current peak levels of a synchronizing signal thereof, and the clamped luminance signal is then FM modulated in an FM modulation circuit. This FM modulation circuit generally comprises an astable multivibrator. This astable multivibrator oscillates at a carrier frequency in a synchronizing signal period, but has an oscillation frequency changing depending on the level of the luminance signal in the other periods. The described carrier frequency is, for example, set at 3.4 MHz in a VHS system, but is generally required to have high accuracy. Accordingly, such as for implementation of the FM modulation circuit in an IC (an integrated circuit), stabilization of the carrier frequency is attempted by adjusting a variable resistor which is externally provided to the IC. Furthermore, the external variable resistor also adjusts a deviation range of the oscillation frequency. Such an FM modulation circuit is, for example, disclosed in Japanese Utility Model Laying-Open No. 60-150865.

However, since the external variable resistor should be adjusted manually in a method of adjusting the carrier frequency thereby, there are disadvantages of time-consuming adjustment and the increasing number of elements. Moreover, even if the adjustment is carried out once, readjustment is required due to changes in temperature and with the passage of time. In addition, since the adjustments are required for both the carrier frequency and the frequency deviation range, and thus the one adjustment influences the other, it is difficult to carry out both adjustments correctly.

SUMMARY OF THE INVENTION

It is an object of the present invention to provide an oscillation circuit having an oscillation frequency automatically adjustable.

It is another object of the present invention to provide an oscillation circuit having the oscillation frequency capable of being set in accordance with a capacitance ratio of capacitors each belonging to two multivibrators.

It is a further object of the present invention to provide an oscillation circuit having the oscillation frequency automatically adjustable in FM modulation of a luminance signal in a video signal.

It is a still further object of the present invention to provide an oscillation circuit having the oscillation frequency and a frequency deviation range individually adjustable without influencing each other in FM modulation of the luminance signal in the video signal.

An oscillation circuit according to the present invention comprising a first multivibrator and a second multivibrator having the same configuration as the first multivibrator, is configured such that an oscillation output signal of the second multivibrator is compared in phase with that of a reference oscillation circuit so as to control the oscillation frequencies of the first and second multivibrators in accordance with the difference in phase between these oscillation output signals. That is, according to the present invention, a PLL (Phase Locked Loop circuit is formed by employing the second multivibrator so as to have the oscillation frequency of the first multivibrator controlled by a control current thereof.

In another aspect of the present invention, capacitors for oscillation frequency control are provided to the first and second multivibrators, respectively.

In still another aspect of the present invention, first and second transistors are provided on respective paths of a control current to be supplied to the first and second multivibrators. Moreover, a clamping circuit is provided to clamp the luminance signal in the video signal, and a voltage corresponding to a reference voltage for clamping of this clamping circuit is applied to the respective bases of the first and second transistors. In addition, a third resistor is provided to adjust a deviation range of the oscillation frequency of the first multivibrator. The third resistor has one end connected to the emitter of the first transistor and the other end supplied with an output signal of the clamping circuit.

According to the present invention, the first multivibrator has its oscillation frequency also adjusted in the same manner as the second multivibrator has, so that an oscillation output signal with a desired frequency can be obtained from the first multivibrator. Particularly, in the case of introducing a luminance signal component via the above described third resistor into the path for supplying therethrough the control current to the first multivibrator, the first multivibrator can be operated as an FM modulation circuit for FM modulating the luminance signal.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
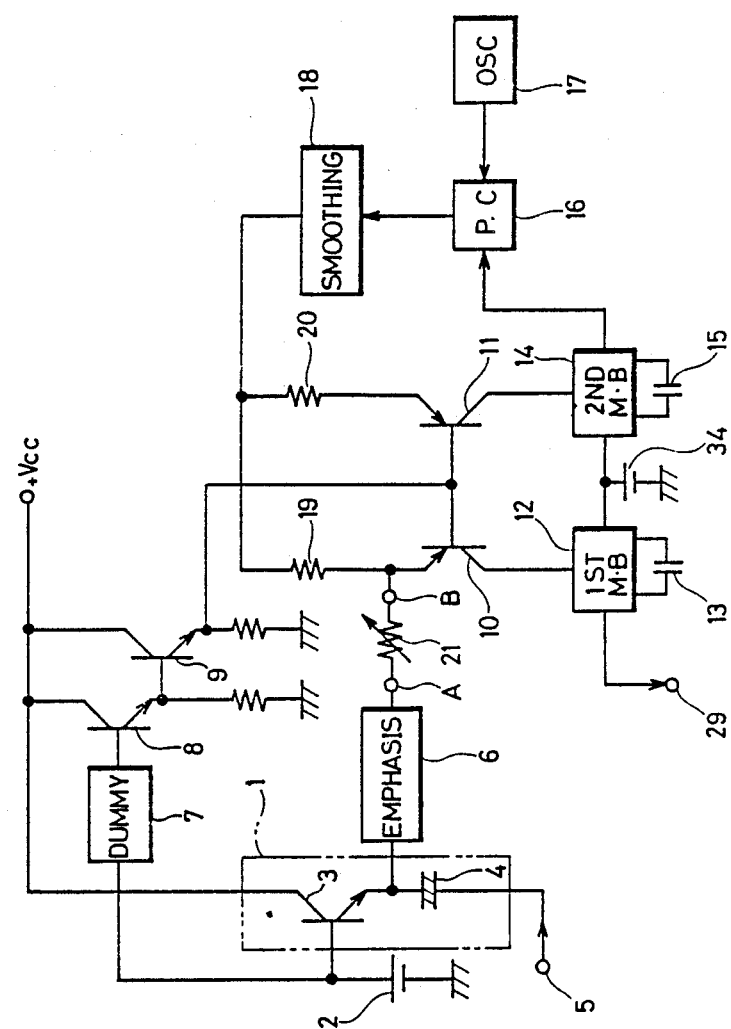
FIG. 1 is a circuit diagram illustrating one embodiment of the present invention.

First of all, one embodiment of the present invention will be described with reference to FIG. 1. As shown in FIG. 1, a clamping circuit 1 comprises a transistor 3 having a base connected to a reference power supply 2 and a collector supplied with a supply voltage +Vcc, and a capacitor 4 having one electrode connected to the emitter of the transistor 3 and the other electrode connected to an input terminal 5. This clamping circuit 1 clamps a luminance signal to be applied to the input terminal 5. The luminance signal outputted from the clamping circuit 1 is applied to an emphasis circuit 6 to be subject to emphasis. A dummy circuit 7 is supplied with a reference voltage from the reference power supply 2. The dummy circuit 7 is configured to have the same response of a direct current level as that of the emphasis circuit 6. An output of the dummy circuit 7 is applied to the base of a transistor 8. The transistor 8 has the collector supplied with the supply voltage +Vcc. Further, the emitter of the transistor 8 is connected to the base of a transistor 9 and is also grounded via a resistor. The transistor 9 has the collector supplied with the supply voltage +Vcc. The emitter of the transistor 9 is connected to the respective bases of the first transistor 10 and the second transistor 11, and is also grounded via a resistor. The transistors 8 and 9 form a level shifting circuit for shifting the level of an output voltage of the dummy circuit 7 by a predetermined value. An output voltage of the level shifting circuit is applied to the respective bases of the first and second transistors 10 and 11.

A first multivibrator 12 having a first capacitor 13 has its oscillation frequency determined by a capacitance value of this capacitor 13 and by a control current from the collector of the first transistor 10. The first multivibrator 12 operates as an FM modulation circuit of a VTR. A second multivibrator 14 having a second capacitor 15 has its oscillation frequency determined by a capacitance value of this second capacitor 15 and by a control current from the collector of the second transistor 11. A phase comparing circuit 16 compares in phase an oscillation output signal of the second multivibrator 14 with that of a fixed oscillation circuit 17. A smoothing circuit 18 smooths an error output of the phase comparing circuit 16. A first resistor 19 and a second resistor 20 are connected between the respective emitters of the first and second transistors 10 and 11 and an output terminal of the smoothing circuit 18. The first and second resistors 19 and 20 are selected to have the same resistance values. A variable resistor 21 is connected between an output terminal A of the emphasis circuit 6 and an emitter terminal B of the first transistor 10. The variable resistor 21 serves to set a deviation range of the oscillation frequency of the first multivibrator 12.

An operation of the embodiment shown in FIG. 1 will now be described. The luminance signal from the input terminal 5 is clamped in the clamping circuit 1 so that the peak of its synchronizing signal has a fixed value of a direct current level. Assuming that a reference voltage of the reference power supply 2 is Vref, a luminance signal whose synchronizing signal has a peak level of Vref-$V_{BE}$ (the $V_{BE}$ is a voltage developed across the base and emitter of the transistor 3), is applied from the emitter of the transistor 3 to the emphasis circuit 6.

Meanwhile, assuming that a direct current potential difference between input and output of the emphasis circuit 6 is $\Delta V$, a direct current potential difference between input and output of the dummy circuit 7, to which the reference voltage Vref is applied from the reference power supply 2 of the clamping circuit 1, is set equally to the $\Delta V$. Accordingly, a constant voltage (Vref+$\Delta V$−2$V_{BE}$) is developed at the emitter of the transistor 9 and applied to the respective bases of the first and second transistors 10 and 11. Therefore, a direct current voltage (Vref+$\Delta V$−$V_{BE}$) is developed at the emitter of the first transistor 10.

Further, since the direct current potential difference between the input and output of the emphasis circuit 6 is the $\Delta V$, a voltage on the terminal A (the output terminal of the emphasis circuit 6) in a synchronizing signal period attains the value of Vref+$\Delta V$−$V_{BE}$, which is equal to a voltage on the terminal B (the emitter of the first transistor 10). Accordingly, no current flows through the variable resistor 21, and only a current from the first resistor 19 flows in the emitter of the first transistor 10.

The oscillation output signal of the second multivibrator 14 having the same circuit configuration as the first multivibrator 12, is applied to the phase comparing circuit 16 to be compared in phase with the oscillation output signal of the fixed oscillation circuit 17, so that an error output thereof is smoothed in the smoothing circuit 18. An output voltage smoothed in the smoothing circuit 18 is then applied to one terminal of the second resistor 20, so that a current corresponding to the value of the output voltage of the smoothing circuit 18 flows through an emitter-collector path of the second transistor 11. The current flowing through the emitter-collector path of the second transistor 11 is supplied as a control current to the second multivibrator 14. Therefore, the second multivibrator 14 can oscillate at the same frequency as that of the fixed oscillation circuit 17.

It is no necessary to newly and separately prepare the fixed oscillation circuit 17 in a home VTR and the like. The home VTR, for example, comprises a low frequency converting circuit for converting a frequency of a chroma signal, and includes an oscillation circuit oscillating at a fixed frequency of 3.58 MHz. The above oscillation circuit oscillates based on a crystal resonator and thus is very stable. Therefore, it is possible to employ as the fixed oscillation circuit 17 the oscillation circuit included in the above described low frequency converting circuit.

Since the output voltage of the smoothing circuit 18 is also applied to one end of the first resistor 19, a current equivalent to the current flowing in the second transistor 11 also flows through the emitter-collector path of the first transistor 10. This current flowing in the first transistor 10 is supplied to the first multivibrator 12. Therefore, the first multivibrator 12 is controlled in the same manner as the second multivibrator 14, thereby stabilizing the oscillation frequency thereof.

A description will be given on determination of the oscillation frequencies of the first and second multivibrators 12 and 14 by the capacitance values of the capacitors and by the values of the control currents.

Figure 2:
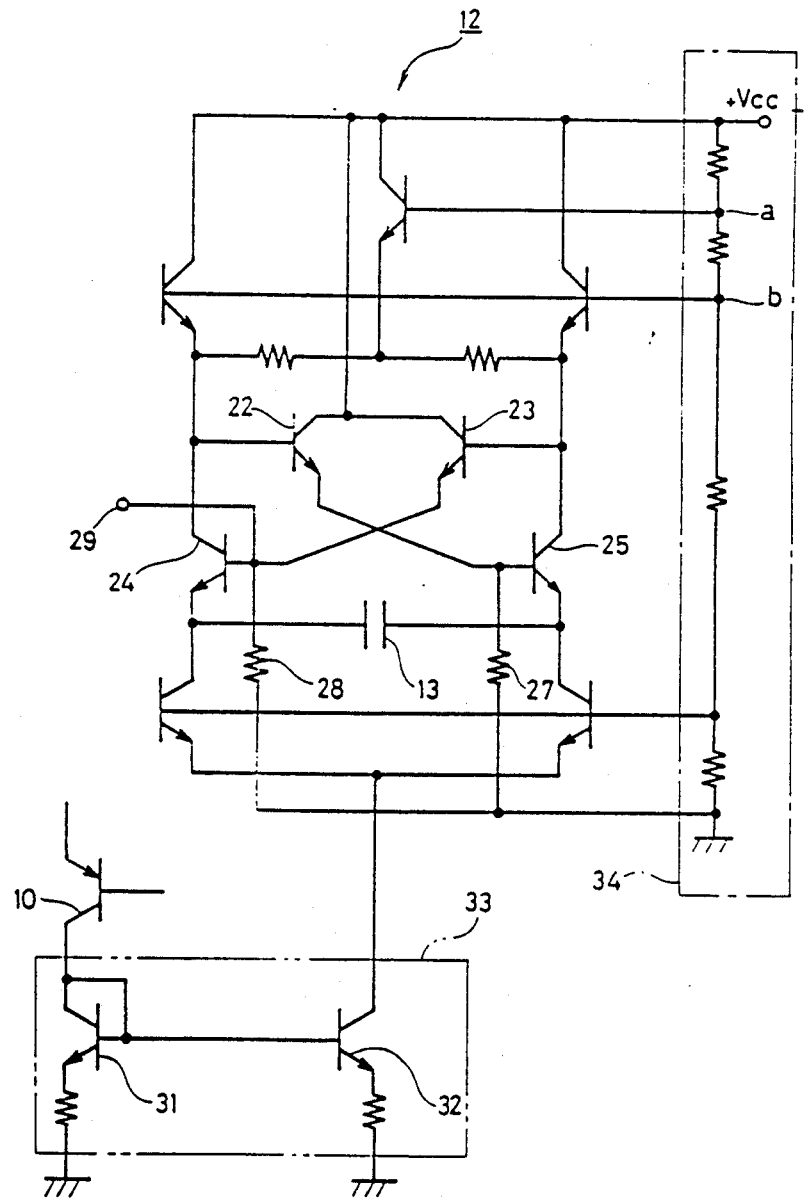
FIG. 2 is a circuit diagram illustrating a detailed circuit example of a first multivibrator shown in FIG. 1.

FIG. 2 is a circuit diagram illustrating a detailed circuit example of the first multivibrator 12 shown in FIG. 1, which is, for example, disclosed in Japanese Patent Publication No. 59-30337. It should be pointed out here that the second multivibrator 14 has approximately the same configuration as that of the first multivibrator 12 which will be described as follows with reference to FIG. 2. In a brief description of the configuration of the first multivibrator 12, an emitter-coupled astable multivibrator portion is formed of transistors 22, 23, 24 and 25, and a capacitor 13. That is, a collector output of the transistor 24 is applied to the base of the transistor 25 via an emitter follower formed of the transistor 22 and a resistor 27. Further, a collector output of the transistor 25 is applied to the base of the transistor 24 via an emitter follower formed of the transistor 23 and a resistor 28. The respective emitters of the transistors 24 and 25 are connected to each other via the capacitor 13 for charging/discharging. This configuration enables the transistors 24 and 25 to be conductive alternately and then the charging/discharging capacitor 13 to be charged/discharged, resulting in a predetermined oscillation output signal at an output terminal 29.

In the above described configuration, a current flowing from the collector of the first transistor 10 (equivalent to the corresponding one in FIG. 1) is supplied to an input of a current mirror circuit 33 formed of transistors 31 and 32. Accordingly, a current which is equivalent to the collector current of the first transistor 10 flows in the collector of the transistor 32, so that the oscillation frequency of the astable multivibrator is controlled.

An oscillation frequency $F_1$ of the oscillation circuit shown in FIG. 2 is expressed as follows.

$$F_1 = I_1/(2C_1 \cdot \Delta V) \quad (1)$$

Here, the $I_1$ represents a collector current of the transistor 32; the $C_1$ is the capacitance value of the charging/discharging capacitor 13; and the $\Delta V$ is a difference voltage between points a and b in a bias source 34. Assuming that the difference voltage $\Delta V$ is a constant value in the expression (1), the oscillation frequency $F_1$ is expressed as follows.

$$F_1 \alpha I_1/C_1 \quad (2)$$

Therefore, the oscillation frequency $F_1$ of the oscillation circuit shown in FIG. 2 is determined in accordance with the current $I_1$ and the capacitance value $C_1$.

Assuming that the oscillation frequencies of the first and second multivibrators 12 and 14 are represented by $F_1$ and $F_2$, respectively, and the above expression (2) is employed therefor, these oscillation frequencies can be expressed as follows.

$$F_1 F_2 = (I_1/C_1)/(I_2/C_2) \quad (3)$$

Here, the $I_1$ and $I_2$ represent collector currents of the first and second transistors 10 and 11, and the $C_1$ and $C_2$ represent capacitance values of the first and second capacitors 13 and 15, respectively. In the case of FIG. 1, since the above collector current $I_1$ and $I_2$ are equivalent to each other, the expression (3) is $$F_1/F_2 = C_2/C_1 \quad (4)$$

and, the oscillation frequency $F_1$ can be expressed as:

$$F_1 = (C_2/C_1)F_2 \quad (5)$$

Accordingly, it is obviously known from the expression (5) that the oscillation frequency $F_1$ of the first multivibrator 12 can be set arbitrarily in accordance with a ratio of the capacitor $C_1$ to $C_2$.

Therefore, according to the oscillation circuit shown in FIG. 1, a carrier frequency of the first multivibrator 12 can automatically be adjusted to a constant value during the synchronizing signal period of a luminance signal. Since the voltage ($V_{ref} - V_{BE} + \Delta V$) in the synchronizing signal period at the terminal A is set equally to a voltage developed in no-signal inputting (a state that a bias due to the power supply is only applied to each of the transistors rather than the luminance signal is) of the oscillation circuit in FIG. 1, the first multivibrator 12 is controlled even in no-signal inputting.

In addition, as apparently seen from the expression (3), the value of the oscillation frequency $F_1$ may be adjusted by equally setting the respective capacitance values $C_1$ and $C_2$ of the capacitors 13 and 15 and by changing the ratio of the collector current $I_1$ to $I_2$. In this case, the values of the first and second resistors 19 and 20 in FIG. 1 may be adjusted.

Next, such a case will be described that a luminance signal in the other periods than the synchronizing signal period is developed at the terminal A. When this luminance signal is generated at the terminal A, a potential difference occurs between both ends of the variable resistor 21, and thus a current corresponding to this potential difference flows in the emitter of the first transistor 10 to be supplied to the first multivibrator 12 via the collector thereof. Accordingly, the first multivibrator 12 has its oscillation frequency changed in accordance with the level of the luminance signal, resulting in an FM modulated luminance signal at the output terminal 29.

Since an emitter voltage of the first transistor 10 is constant at this time, the current flowing in the first resistor 19 does not change, so that the carrier frequency is kept being adjusted. That is, a current for adjusting the carrier frequency and a current for controlling the oscillation frequency are superimposed together without interfering with each other and supplied to the first multivibrator 12, so that the oscillation frequency thereof is controlled.

The bias source 34 shown in FIG. 1 is, for example, formed of a voltage dividing circuit comprising a plurality of resistors connected in series between the power supply $+V_{cc}$ and the ground such as the bias source 34 shown in FIG. 2. A bias voltage is applied from the same bias source 34 to the first and second multivibrators 12 and 14. Accordingly, the $\Delta V$ in the expression (1) can be set to be completely the same values, resulting in further enhanced accuracy in frequency setting.

Figure 3:
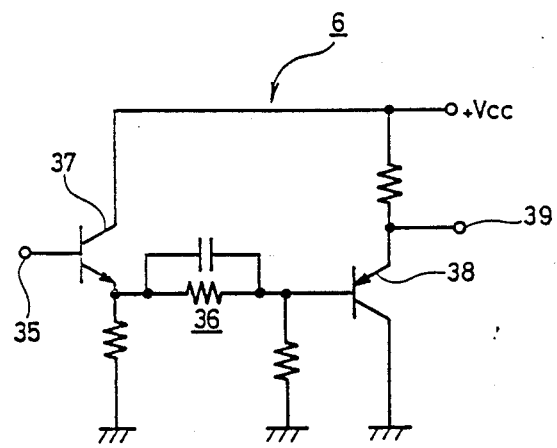
FIG. 3 is a circuit diagram illustrating a detailed circuit example of an emphasis circuit shown in FIG. 1.

FIG. 3 is a circuit diagram illustrating a detailed circuit example of the emphasis circuit 6 shown in FIG. 1. As shown in this figure, a luminance signal from an input terminal 35 is applied to the base of a transistor 37 and then applied to a emphasis portion 36 from the emitter thereof to be subject to emphasis. The emphasized luminance signal is provided to an output terminal 39 via a transistor 38 for level shifting.

Figure 4:
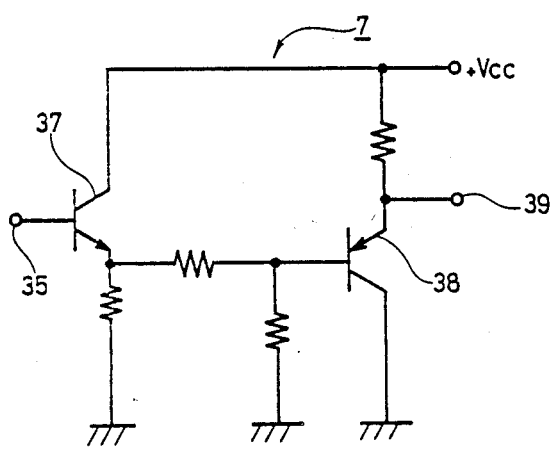
FIG. 4 is a circuit diagram illustrating a detailed circuit example of a dummy circuit shown in FIG. 1.

FIG. 4 is a circuit diagram illustrating a detailed circuit example of a dummy circuit 7 shown in FIG. 1. The dummy circuit 7 shown in FIG. 4 has the same configuration as that of the emphasis circuit 6 shown in FIG. 3 except the point that the circuit 7 does not include the capacitor for emphasis. That is, the circuit of FIG. 4 is the one having the resistors, with the capacitor removed from the emphasis portion 36 in FIG. 3. Accordingly, the dummy circuit 7 of FIG. 4 has the same direct current level change as that of the emphasis circuit 6 of FIG. 3. Therefore, the terminals A and B shown in FIG. 1 can have completely the same direct current levels.

As has been described in the foregoing, according to the present invention, the carrier frequency of the oscillation circuit can be adjusted automatically. Particularly, in the present invention, since a so-called PLL circuit is configured by the second multivibrator 14, and the control current thereof controls the oscillation frequency of the first multivibrator 12, the oscillation frequency (the carrier frequency) of the first multivibrator 12 can be adjusted such as by a capacitance ratio of these two multivibrators. Thus, setting of this capacitance ratio to a desired value results in an oscillation output signal of high accuracy.

Although the present invention has been described and illustrated in detail, it is clearly understood that the

What is claimed is:

1. An oscillation circuit, comprising:
   a first multivibrator (12);
   a second multivibrator (14) having the same circuit configuration as that of said first multivibrator;
   a reference oscillation circuit (17) oscillating at a constant frequency;
   a phase comparing circuit (16) for comparing in phase an oscillation output signal of said reference oscillation circuit with that of said second multivibrator; and
   a smoothing circuit (18) for smoothing an output signal of said phase comparing circuit to supply the smoothed output to said first and second multivibrators as a control current for determining an oscillation frequency,
   whereby an oscillation frequency of said first multivibrator is stabilized.

2. An oscillation circuit, comprising:
   a first multivibrator (12) having a first capacitor (13), which has an oscillation frequency controlled by a capacitance of the first capacitor and by a control current;
   a second multivibrator (14) having a second capacitor (15), which has an oscillation frequency controlled by a capacitance of the second capacitor and by a control current;
   a reference oscillation circuit (17) oscillating at a constant frequency;
   a phase comparing circuit (16) for comparing in phase an oscillation output signal of said reference oscillation circuit with that of said second multivibrator; and
   a smoothing circuit (18) for smoothing an output signal of said phase comparing circuit to supply the smoothed output as a control current to said first and second multivibrators,
   whereby the oscillation frequency of said first multivibrator can be set in accordance with a capacitance ratio of said first capacitor to said second capacitor.

3. An oscillation circuit, comprising:
   a first multivibrator (12) having a first capacitor (13), which has an oscillation frequency controlled by a capacitance of the first capacitor and by a control current;
   a second multivibrator (14) having a second capacitor (15), which has an oscillation frequency controlled by a capacitance of the second capacitor and by a control current;
   a reference oscillation circuit (17) oscillating at a constant frequency;
   a phase comparing circuit (16) for comparing in phase an oscillation output signal of said reference oscillation circuit with that of said second multivibrator;
   a smoothing circuit (18) for smoothing an output signal of said phase comparing circuit;
   a clamping circuit (1) for clamping a luminance signal in a video signal;
   first and second transistors (10, 11) having respective bases supplied with a voltage corresponding to a reference voltage for clamping said clamping circuit;
   first and second resistors (19, 20) connected between the respective emitters of said first and second transistors and a output terminal of said smoothing circuit, respectively; and
   a third resistor (21) having one end connected to the emitter of said first transistor and also the other end supplied with an output signal of said clamping circuit,
   whereby a collector current of said first and second transistors is supplied as a control current to said first and second multivibrators, and
   an output terminal of said first multivibrator provides an oscillation output signal having an oscillation frequency changed in accordance with a luminance signal.

4. An oscillation circuit according to claim 3, wherein a value of said first resistor is set equally to that of said second resistor.

5. An oscillation circuit according to claim 3, wherein said first and second resistors each comprise fixed resistors, and said third resistor comprises a variable resistor.

6. An oscillation circuit, comprising:
   a first multivibrator (12) having affrst capacitor (13), which has an oscillation frequency controlled by a capacitance of the first capacitor and by a control current;
   a second multivibrator (14) having a second capacitor (15), which has an oscillation frequency controlled by a capacitance of the second capacitor and by a control current;
   a reference oscillation circuit (17) oscillating at a constant frequency;
   a phase comparing circuit (16) for comparing in phase an oscillation output signal of said reference oscillation circuit with that of said second multivibrator;
   a smoothing circuit (18) for smoothing an output signal of said phase comparing circuit;
   a clamping circuit (1) for clamping a luminance signal in a video signal;
   an emphasis circuit (6) for emphasizing a luminance signal from said clamping circuit;
   a dummy circuit (7) supplied with a reference voltage for clamping said clamping circuit and having the same direct current fluctuation as that of said emphasis circuit;
   first and second transistors (10, 11) having the respective bases supplied with an output voltage of said dummy circuit;
   first and second resistors (19, 20) connected between the respective emitters of said first and second transistors and an output terminal of said smoothing circuit, respectively; and
   a third resistor (21) connected between the emitter of said first transistor and an output terminal of said emphasis circuit,
   whereby a current flowing from the respective collectors of said first and second transistors is supplied as a control current to said first and second multivibrators, and
   an output terminal of said first multivibrator provides an oscillation output signal having an oscillation frequency changed in accordance with the luminance signal.

7. An oscillation circuit according to claim 6, wherein a value of said first resistor is set equally to that of said second resistor.

8. An oscillation circuit according to claim 6, wherein said first and second resistors each comprise fixed resistors, and said third resistor comprises a variable resistor.

* * * * *